(12) United States Patent
Chan et al.

(10) Patent No.: US 7,949,980 B1
(45) Date of Patent: May 24, 2011

(54) CIRCUIT DESIGN TOOLS THAT SUPPORT DEVICES WITH REAL-TIME PHASE-LOCKED LOOP RECONFIGURATION CAPABILITIES

(75) Inventors: Ian Eu Meng Chan, Gelugor (MY); Kumara Tharmalingam, San Jose, CA (US)

(73) Assignee: Altera Corporation, San Jose, CA (US)

( * ) Notice: Subject to any disclaimer, the term of this patent is extended or adjusted under 35 U.S.C. 154(b) by 364 days.

(21) Appl. No.: 12/184,223

(22) Filed: Jul. 31, 2008

(51) Int. Cl.
*G06F 17/50* (2006.01)
*G06F 15/177* (2006.01)
*G06F 9/00* (2006.01)

(52) U.S. Cl. ............ 716/117; 716/121; 716/111; 713/2; 713/100

(58) Field of Classification Search ................ 716/4, 16, 716/18, 111, 11, 121, 7; 713/2, 100
See application file for complete search history.

(56) References Cited

U.S. PATENT DOCUMENTS

| | | | |
|---|---|---|---|
| 5,946,478 A * | 8/1999 | Lawman | 716/17 |
| 6,567,957 B1 * | 5/2003 | Chang et al. | 716/4 |
| 6,574,778 B2 * | 6/2003 | Chang et al. | 716/1 |
| 6,594,800 B2 * | 7/2003 | Chang et al. | 716/1 |
| 6,629,293 B2 * | 9/2003 | Chang et al. | 716/4 |
| 6,631,470 B2 * | 10/2003 | Chang et al. | 716/3 |
| 6,694,501 B2 * | 2/2004 | Chang et al. | 716/10 |
| 6,698,002 B2 * | 2/2004 | Chang et al. | 716/4 |
| 7,159,204 B2 * | 1/2007 | Iotov et al. | 716/16 |
| 7,555,741 B1 * | 6/2009 | Milton et al. | 716/16 |
| 7,634,752 B2 * | 12/2009 | Iotov et al. | 716/16 |
| 7,669,151 B1 * | 2/2010 | Boyle et al. | 716/2 |
| 2007/0074140 A1 * | 3/2007 | Yancey et al. | 716/16 |
| 2007/0261014 A1 * | 11/2007 | Iotov et al. | 716/16 |

FOREIGN PATENT DOCUMENTS

WO   WO 2004109923 A1 * 12/2004

* cited by examiner

*Primary Examiner* — Phallaka Kik
(74) *Attorney, Agent, or Firm* — Treyz Law Group; David C. Kellogg; G. Victor Treyz

(57) ABSTRACT

Computer-aided-design tools are provided that support real-time phase-locked loop reconfiguration with a single design compilation. Each design compilation may involve operations such as logic synthesis and place and route operations. A circuit designer who is designing an integrated circuit may supply circuit design data. The circuit design data may include design data for multiple configurations of a phase-locked loop. By using a phase-locked loop scan chain initialization file generator engine located in a CAD tool design input wizard, the computer-aided-design tools may produce multiple phase-locked loop initialization files without performing a design compilation. The CAD tools may process one or more initialization files and the circuit design data to produce output data. The output data may include configuration data to implement the circuit design. The output data may also include warning messages that indicate when phase-locked loop settings in an initialization file do not match settings in the circuit design.

20 Claims, 10 Drawing Sheets

Warning: The contents of the scan chain initialization file pll_d1_clk0.mif for the PLL does not match the initial state of the scan chain for the PLL ⏤92

Warning: The values for the Loop Filter Resistance parameter do not match

Info: The value in the scan chain initialization file: 2.50 KOhm

Info: The value in the PLL node: 1.00 KOhm

Warning: The values for the clk1 Counter Phase Step Control parameter do not match Info: The value in the scan chain initialization file: 1

Info: The value in the PLL node: 0

FIG. 8

CIRCUIT DESIGN TOOLS THAT SUPPORT DEVICES WITH REAL-TIME PHASE-LOCKED LOOP RECONFIGURATION CAPABILITIES

BACKGROUND

This invention relates to circuit design, and more particularly, to circuit design tools that support devices in which phase-locked loop circuits can be dynamically reconfigured.

Complex integrated circuit designs are typically created using circuit design tools such as computer-aided-design (CAD) tools. For example, logic designers that are designing custom logic circuits for programmable logic devices (PLDs) use PLD design tools to help create their designs. Designers of application specification integrated circuits (ASICs) and other integrated circuits also use CAD tools during the design process.

After a circuit designer has input a desired circuit design, the circuit designer uses the CAD tools to generate an output in a desired format. The CAD tools may, for example, use the specified design to generate configuration data for a programmable logic device. The configuration data can be loaded into the programmable logic device to create a custom logic circuit implementation of the circuit design.

A logic designer may use CAD tools to design integrated circuits with real-time dynamic reconfiguration capabilities. For example, a logic designer may be able to use CAD tools to generate one or more phase-locked loop initialization files, each of which corresponds to a particular phase-locked loop configuration, for integrated circuits that support real-time dynamic reconfiguration of phase-locked loop circuitry.

Conventional CAD tools require that logic designers perform design compilations for each phase-locked loop configuration (e.g., to generate corresponding phase-locked loop initialization files) and a final design compilation using the initialization files together with the actual design of the integrated circuit. Each compilation typically requires synthesis operations and a fitting process (e.g., a place and route process) to generate an appropriate output and can therefore take a relatively long time to execute. Because the number of required design compilations increases with the number of phase-locked loop configurations when using conventional CAD tools, the conventional CAD tools can require an undesirably long period of time to complete design compilation.

It would therefore be desirable to be able to provide improved circuit design tools that support devices with phase-locked loop reconfiguration capabilities.

SUMMARY

In accordance with the present invention, computer-aided-design tools are provided that help a circuit designer that is working on implementing a given circuit design on an integrated circuit. The circuit designer can use the computer-aided-design tools to input a design. The designer can implement dynamically reconfigurable phase-locked loop circuitry that allows the phase-locked loop circuitry to be reconfigured in real-time during the operation of the integrated circuit.

The computer-aided-design tools can generate phase-locked loop scan chain initialization files without requiring a design compilation. By not requiring design compilations to generate phase-locked loop initialization files, the computer-aided-design tools may require relatively less time to generate initialization files compared to conventional computer-aided-design tools.

After the circuit designer has generated one or more phase-locked loop initialization files, the designer may use the computer-aided-design tools to compile the circuit design together with the phase-locked loop initialization files. When the computer-aided-design tools compile the circuit design and the phase-locked loop initialization files, the computer-aided-design tools will generate an output in a desired format. The computer-aided-design tools may, for example, generate configuration data for a programmable logic device that can be loaded into a programmable logic device to create a custom logic circuit implementation of the circuit design.

As part of the design compilation, the computer-aided-design tools may generate warning messages related to phase-locked loop parameters. For example, the design tools may generate a specific warning message for each phase-locked loop parameter in a phase-locked loop initialization file that does not match the corresponding phase-locked loop parameter in the circuit design. If desired, these specific warning messages may include information identifying the phase-locked loop parameter as well as the two conflicting parameter values in the initialization file and in the circuit design.

Further features of the invention, its nature and various advantages will be more apparent from the accompanying drawings and the following detailed description of the preferred embodiments.

BRIEF DESCRIPTION OF THE DRAWINGS

FIG. 8 shows illustrative warning messages that may be displayed by CAD tools when one or more mismatches are found by the CAD tools between phase-locked loop settings in a phase-locked loop initialization file and in a design netlist in accordance with an embodiment of the present invention.

DETAILED DESCRIPTION

The present invention relates to circuit design tools that support real-time phase-locked loop reconfiguration with a single design compilation. The circuit design tools (e.g., computer-aided-design tools) may be used to implement a desired custom logic design in a programmable logic device integrated circuit. With this type of arrangement, the circuit design tools may produce programming data that is loaded into an unprogrammed programmable logic device to configure the device to perform a custom logic function. The circuit design tools may also be used to construct a mask set for implementing a given circuit design as an integrated circuit.

The circuit design tools of the present invention may support real-time phase-locked loop reconfiguration with a single design compilation. This allows the circuit designer to design an integrated circuit with multiple phase-locked loop configurations that can be selected between based on the desired operation of the integrated circuit. Because only a single design compilation is required, the circuit design tools of the present invention may require less time overall relative to conventional circuit design tools to prepare the final set of programming data that is loaded into the unprogrammed programmable logic device.

Figure 1:
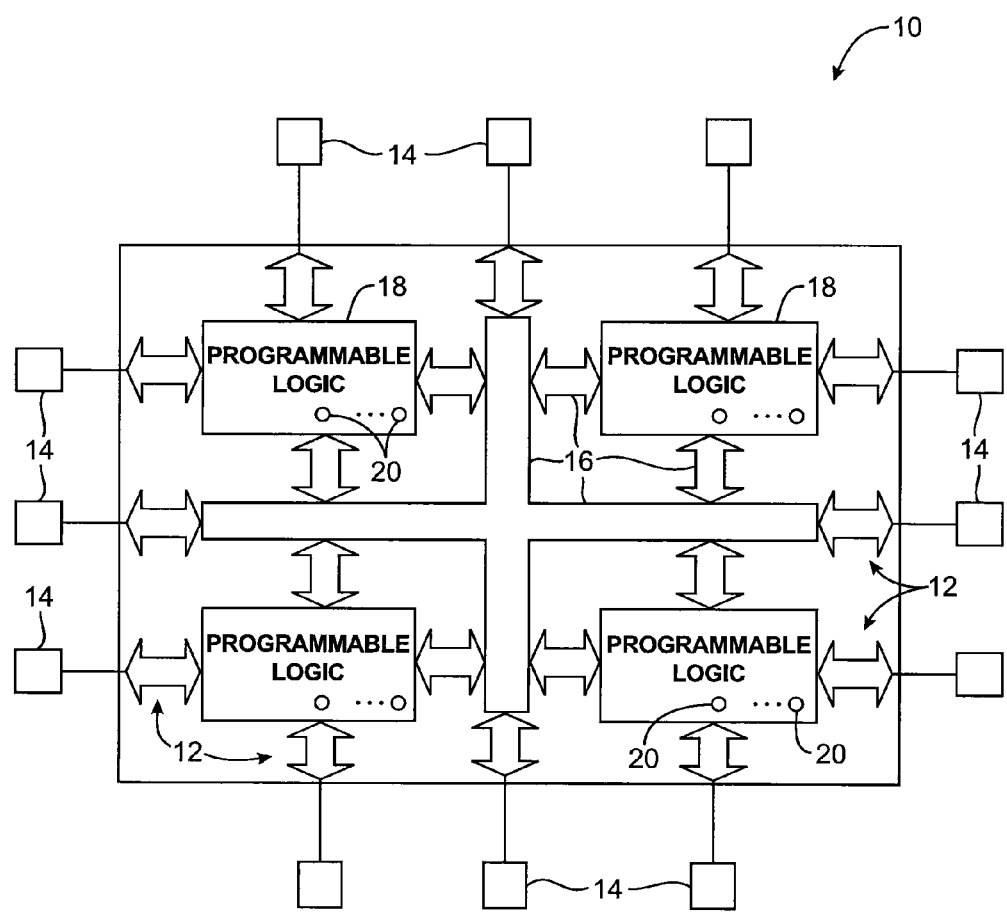
FIG. 1 is a diagram of an illustrative programmable logic device in accordance with an embodiment of the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers and logic array blocks (LABS).

When a memory element supplies a high output to an NMOS pass transistor, the transistor is turned on and passes logic signals from its input to its output. When the memory element output is low, the pass transistor is turned off and does not pass logic signals. Being able to configure pass transistors in this way allows the logic of the programmable logic device to be programmed to implement a desired logic design.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are typically random-access-memory (RAM) elements. As a result, these programmable logic device memory elements are sometimes referred to as configuration random-access-memory (CRAM) cells. Other terms that are sometimes used to refer to memory elements 20 include terms such as memory cells, static random-access-memory elements or cells, RAM cells, RAM elements, CRAM cells, configuration elements, volatile memory elements, configuration bits, etc. In a typical modern programmable logic device, there may be millions of memory elements 20 on each chip. Although sometimes described herein in the context of CRAM bits, memory elements may, in general, be fabricated using any suitable memory element technology.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
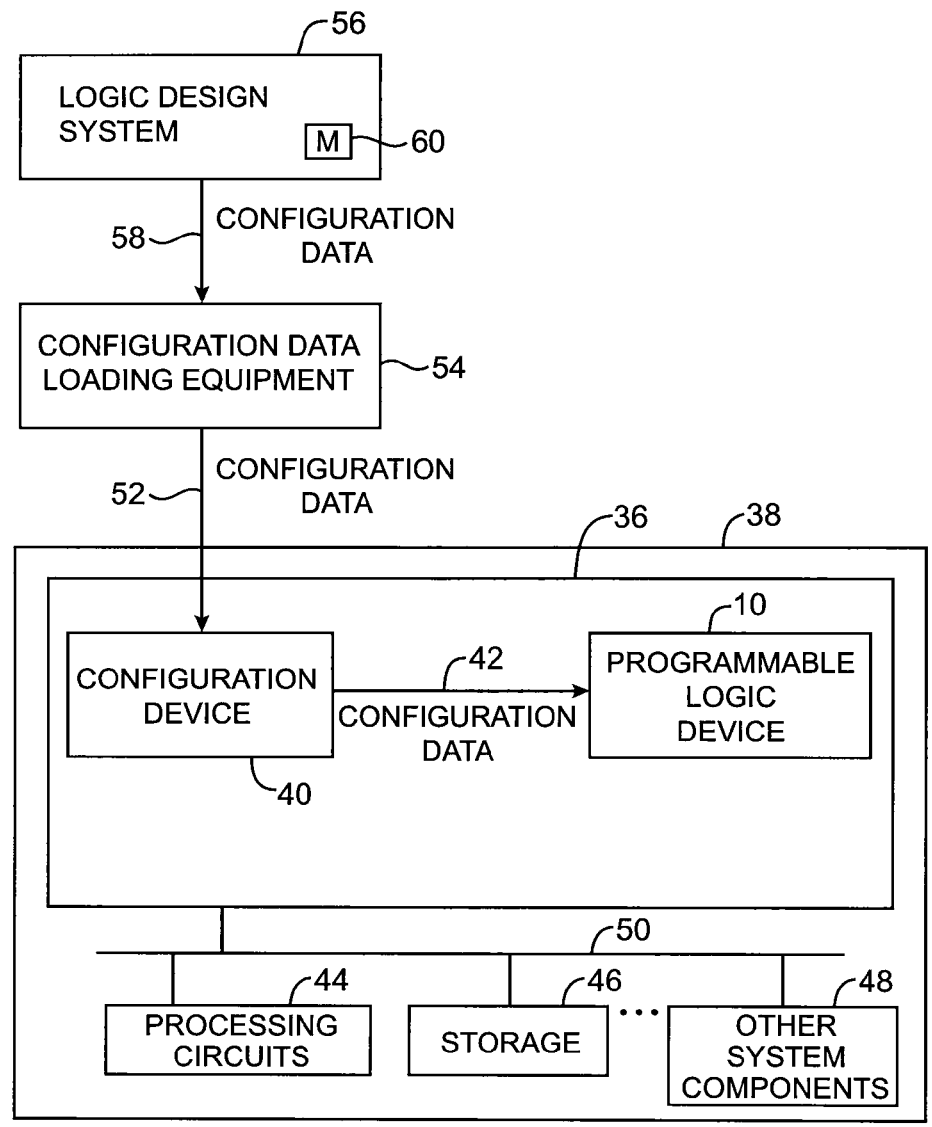
FIG. 2 is a diagram showing how programmable logic device configuration data is created by a logic design system and loaded into a programmable logic device to configure the device for operation in a system in accordance with an embodiment of the present invention.

An illustrative system environment for a programmable logic device 10 is shown in FIG. 2. Programmable logic device 10 may be mounted on a board 36 in a system 38. In general, programmable logic device 10 may receive programming data from programming equipment or from any other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. The circuit 40 may be an erasable-programmable read-only memory (EPROM) chip, a programmable logic device configuration data loading chip with built-in memory (sometimes referred to as a configuration device), or any other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42.

Logic circuit design system 56 includes processing circuitry and storage 60. In supporting design operations involved in implementing a desired custom logic function, the logic design system 56 can use software implemented using circuitry and storage 60 to make phase-locked loop initialization files without performing design compilations.

Figure 3:
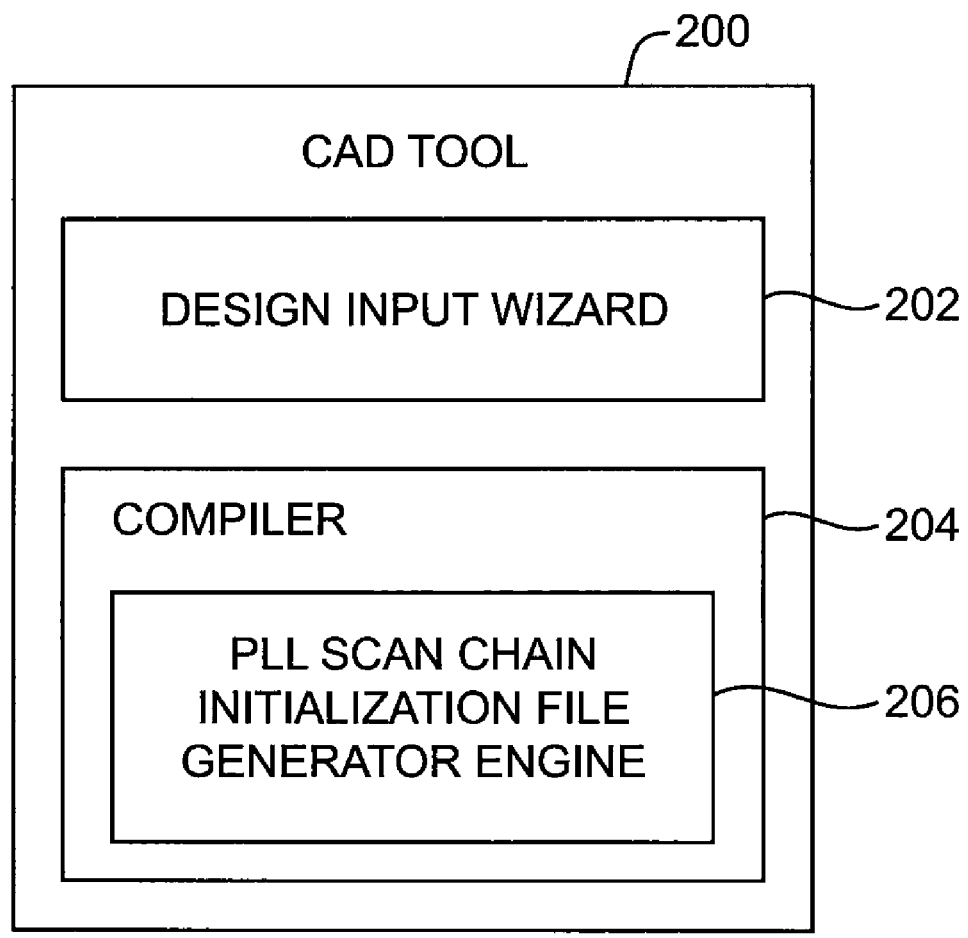
FIG. 3 is a diagram of a conventional computer-aided-design tool.

A conventional computer-aided-design tool 200 is shown in FIG. 3. CAD tool 200 is used to design custom logic circuits with real-time dynamic phase-locked loop reconfiguration features.

Design input wizard 202 is used by a logic designer to design and create circuit designs.

Compiler 204 is used to compile circuit designs that are provided by circuit designers through design input wizard 202 to generate appropriate outputs.

Phase-locked loop scan chain initialization file generator engine 206 is used to generate phase-locked loop initialization files for corresponding phase-locked loop configurations. The phase-locked loop scan chain initialization file generator engine 206 is specific to a particular type of integrated circuit (e.g., a particular model of a programmable logic device integrated circuit) and the parameters of that integrated circuit that have to be processed by engine 206 are hardcoded into engine 206.

With the conventional computer-aided-design tool arrangement, each time the phase-locked loop scan chain initialization file generator engine 206 is used to generate a different phase-locked loop initialization file, the compiler 204 must execute a compilation. Sometimes, a phase-locked loop initialization file is generated by inserting a particular phase-locked loop design configuration into a placeholder circuit design and then compiling the placeholder circuit design. However, because the compiler 204 must still compile the placeholder circuit or even a potentially more complex circuit design in order to generate the phase-locked loop initialization file for each phase-locked loop configuration, the conventional CAD tool 200 may require an unacceptably long amount of time to complete the circuit design.

Even when only a single phase-locked loop configuration is included in the circuit design, the conventional CAD tool 206 still requires two separate time-consuming compilations. A first compilation is required to generate the single phase-locked loop initialization file and a second compilation is required to complete the final circuit design.

Figure 4:
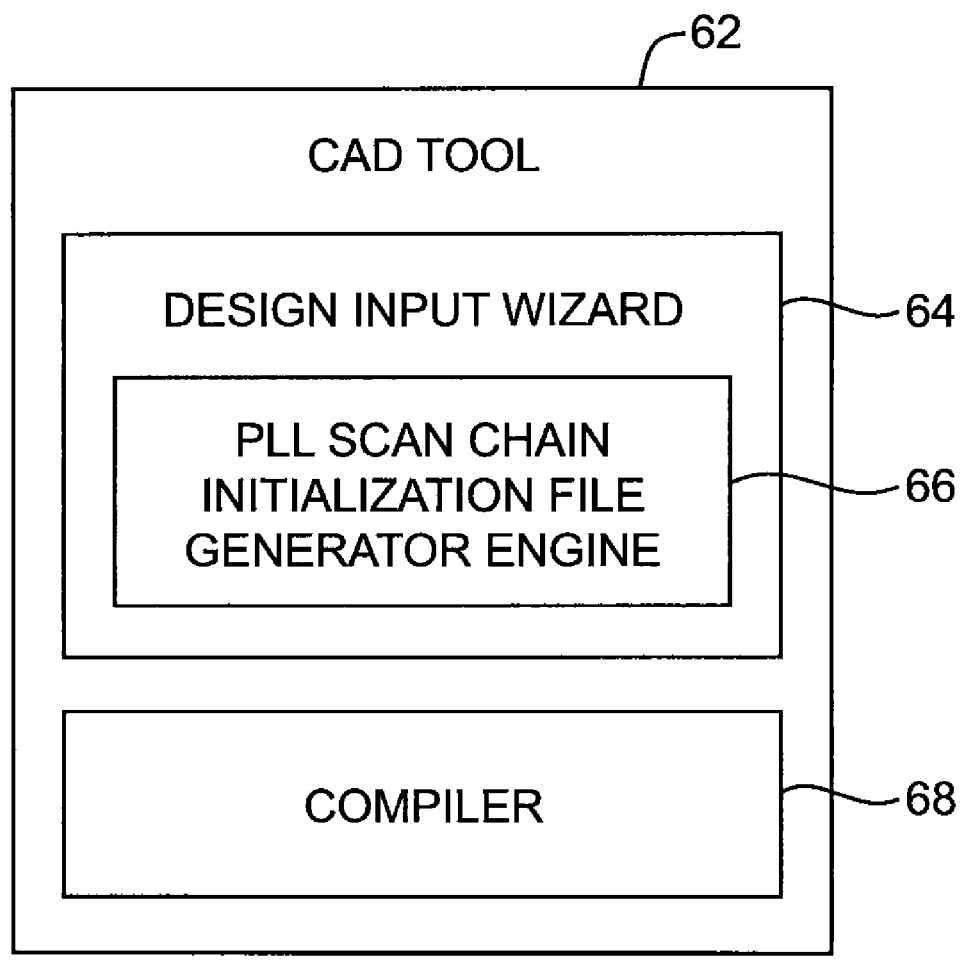
FIG. 4 is a diagram of an illustrative computer-aided-design tool that supports real-time phase-locked loop reconfiguration with a single design compilation in accordance with an embodiment of the present invention.

An illustrative computer-aided-design tool 64 in accordance with the present invention is shown in FIG. 4. CAD tool 64 may be implemented on a logic design system 56 that is based on one or more processors such as personal computers, workstations, etc. The processor(s) may be linked using a network (e.g., a local or wide area network). Memory in these computers or external memory and storage devices such as internal and/or external hard disks may be used to store instructions and data.

During operation, executable software such as the software of computer-aided-design tools 62 runs on the processor(s) of system 56. Databases are used to store data for the operation of system 56. In general, software and data may be stored on any computer-readable medium (storage) in system 56. Such storage, which is shown schematically as storage 60 of FIG. 2, may include computer memory chips, removable and fixed media such as hard disk drives, flash memory, compact discs (CDs), DVDs, other optical media, and floppy diskettes, tapes, or any other suitable memory or storage device(s). When CAD tool 62 is installed in system 56, the storage 60 of system 56 has instructions and data that cause the computing equipment in system 56 to execute various methods (processes). When performing these processes, the computing equipment is configured to implement the functions of a circuit design system.

The tools associated with computer-aided-design (CAD) tool 62, some or all of which are sometimes referred to collectively as a CAD tool, may be provided by a single vendor or multiple vendors. CAD tool 62 may be provided as one or more suites of tools (e.g., a compiler suite for performing tasks associated with implementing a circuit design in a programmable logic device) and/or as one or more separate software components (tools). Database(s) may include one or more databases that are accessed only by a particular tool or tools and may include one or more shared databases. Shared databases may be accessed by multiple tools. For example, a first tool may store data for a second tool in a shared database. The second tool can access the shared database to retrieve the data stored by the first tool. This allows one tool to pass information to another tool. Tools may also pass information between each other without storing information in a shared database if desired.

The design process typically starts with the formulation of logic circuit functional specifications through design input wizard 64. A logic designer can specify how a desired circuit should function using design and constraint entry tools. Design and constraint entry tools may include tools such as a design and constraint entry aid and a design editor that are a part of design input wizard 64. Design and constraint entry aids may be used to help a logic designer locate a desired design from a library of existing logic designs and may provide computer-aided assistance to the logic designer for entering (specifying) the desired design. As an example, the design and constraint entry aid may be used to present screens of options for a circuit designer. The circuit designer may click on on-screen options to select whether the circuit being designed should have certain features. The design editor may be used to enter a design (e.g., by entering lines of hardware description language code), may be used to edit a design obtained from a library (e.g., using a design and constraint entry aid), or may assist a circuit designer in selecting and editing appropriate prepackaged code/designs.

Design input wizard 64 may be used to allow a logic designer to provide a desired logic design using any suitable format. For example, design input wizard 64 may include tools that allow the logic designer to enter a logic design using truth tables. Truth tables can be specified using text files or timing diagrams and may be imported from a library. Truth table logic design and constraint entry may be used for a portion of a large circuit or for an entire circuit.

As another example, design input wizard 64 may include a schematic capture tool. A schematic capture tool may allow the logic designer to visually construct logic circuits from constituent parts such as logic gates and groups of logic gates. Libraries of preexisting logic circuits may be used to allow a desired portion of a design to be imported with the schematic capture tools.

If desired, design input wizard 64 may allow the logic designer to provide a logic design (e.g., a design netlist) to the logic design system using a hardware description language such as Verilog hardware description language (HDL) or Very High Speed Integrated Circuit Hardware Description Language (VHDL). The designer of the logic circuit can enter the logic design by writing hardware description language code with the design editor. Blocks of code may be imported from user-maintained or commercial libraries if desired.

After the design has been entered using design input wizard 64, behavioral simulation tools may be used to simulate the functional performance of the design. If the functional performance of the design is incomplete or incorrect, the logic designer can make changes to the design using the design input wizard 64. The functional operation of the new design can be verified using behavioral simulation tools before compilation (e.g., synthesis) operations have been performed using compiler 68. Simulation tools may also be used at other stages in the design flow if desired (e.g., after logic synthesis). The output of the behavioral simulation tools may be provided to the logic designer in any suitable format (e.g., truth tables, timing diagrams, etc.).

In accordance with the present invention, logic designers can design integrated circuits that utilize dynamic real-time phase-locked loop reconfiguration. With this type of arrangement, multiple phase-locked loop configurations may be implemented using a single phase-locked loop circuit by dynamically reconfiguring the phase-locked loop circuit during operation of the circuit. For example, the phase-locked loop circuit of a programmable logic device may be configured to operate at a first frequency when the PLD is first activated and may be configured to operate at a second frequency after a set of conditions has been met.

Logic designers can use design input wizard 64 and phase-locked loop scan chain initialization file generator engine 66 to generate phase-locked loop initialization files for each phase-locked loop configuration. Each phase-locked loop initialization file may be, for example, scan chain data used to load configuration data representative of a particular phase-locked loop configuration into the programmable circuitry corresponding to the phase-locked loop circuit. The phase-locked loop initialization file may be provided in any suitable format such as a Memory Initialization File (MIF) file format or a hexadecimal (HEX) file format. Each phase-locked loop initialization file may contain the bit settings for each of the reconfigurable parameters of the phase-locked loop circuitry.

Phase-locked loop initialization file engine 66 produces initialization files without requiring a design compilation. By avoiding the requirement in conventional circuit design systems to perform a design compilation of a placeholder design or a more complex design to generate phase-locked loop initialization files, the logic designer may be able to complete the circuit design faster than with conventional circuit design systems.

If desired, the phase-locked loop initialization file engine 66 may be provided as a software engine that is programmed generically (e.g., software that is not hardcoded to a particular model of integrated circuit). For example, engine 66 may be software that is designed to be data-driven and capable of generating initialization files for multiple families of integrated circuits (i.e., multiple types of devices) with minimal changes to the software of engine 66 between implementations for different families of circuits. Because this type of engine 66 is data-driven (i.e., not specifically implemented for a particular circuit family), it may be easier to maintain the compatibility of engine 66 with future circuit families as they are developed.

Different circuit families potentially have different properties such as different sets of reconfigurable phase-locked loop parameters, different ordering of phase-locked loop parameters in their scan chain initialization files, different orderings of most-significant-bits versus least-significant-bits in phase-locked loop setting values, different representations of phase-locked loop setting values such as an actual setting value versus a setting index value, etc.

After the logic designer has completed designing the integrated circuit using design input wizard 64 and the appropriate phase-locked loop initialization files have been generated with engine 66, compiler 68 may be used to compile the integrated circuit design and generate an output in a desired format. For example, compiler 68 may use the design specified using wizard 64 and the phase-locked loop initialization files generated by engine 66 to generate configuration data for a programmable logic device. The configuration data can be loaded into the programmable logic device to create a custom logic circuit implementation of the circuit design.

Figure 5:
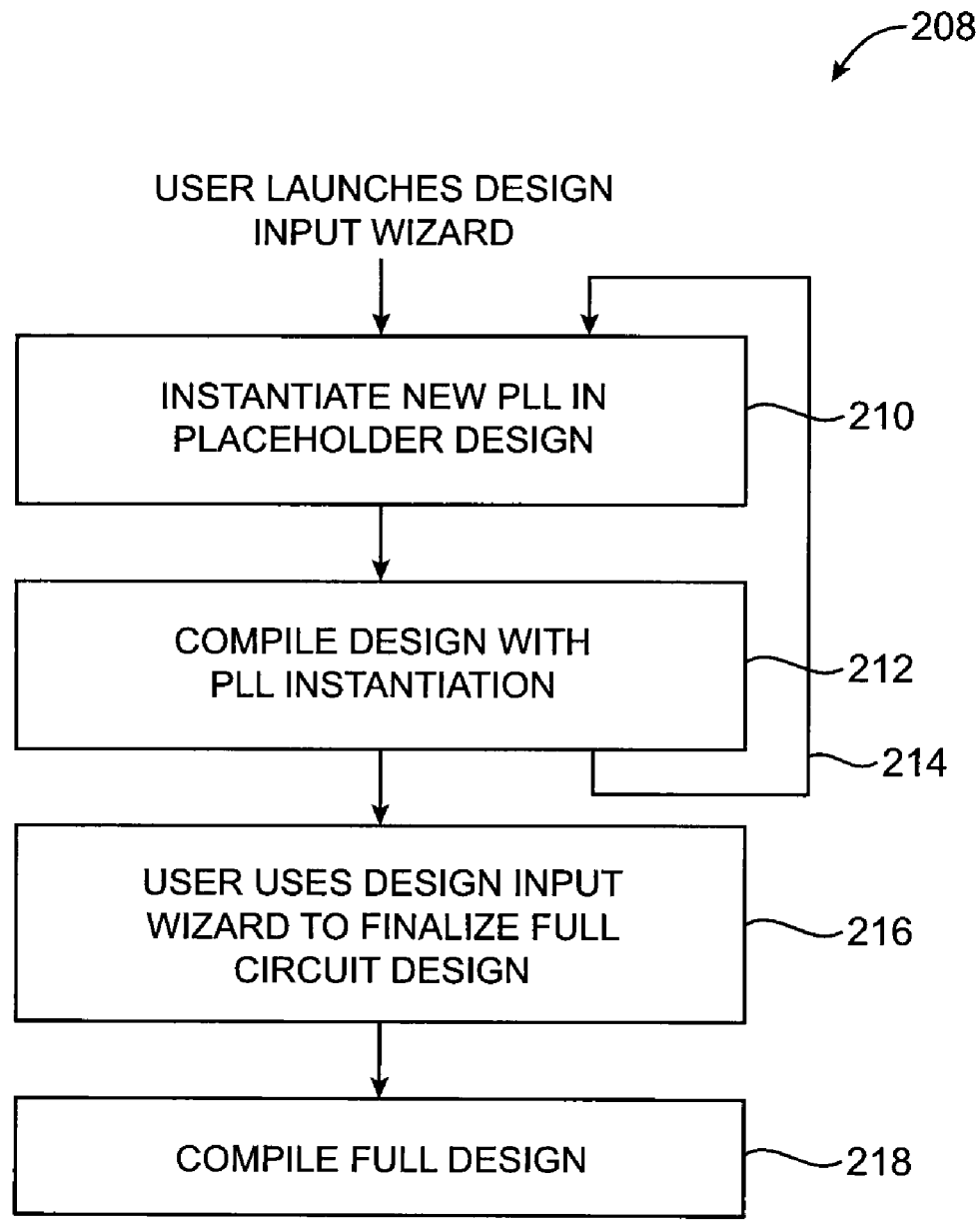
FIG. 5 is a flowchart of conventional steps involved in compiling placeholder designs and a circuit design for a circuit with real-time phase-locked loop reconfiguration.

Steps involved in compiling placeholder designs and a circuit design for a circuit with real-time phase-locked loop reconfiguration capabilities are shown in FIG. 5.

As indicated by line 208, a user may launch design input wizard 202 to initiate a circuit design process.

At step 210, the user may instruct tool 200 to instantiate a new phase-locked loop configuration in a placeholder design.

At step 212, the user may direct tool 200 to compile the placeholder design that includes the phase-locked loop instantiation using compiler 204 and its phase-locked loop scan chain initialization file generator engine 206, thereby generating a phase-locked loop initialization file.

As indicated by loop 214, the user may prepare phase-locked loop initialization files for additional phase-locked loop configurations by using tool 200 to repeat steps 210 and 212. Each pass through loop 214 will, however, require that an additional compilation be performed using compiler 204.

In step 216, the user may use design input wizard 202 to finalize the entry of the full circuit design.

After the full circuit design has been entered using design input wizard 202 and the desired phase-locked loop initialization files have been prepared using compiler 204 and engine 206, compiler 204 may be used to compile the full circuit design (step 218). During compilation operations, compiler 204 may use the phase-locked loop initialization files that were generated during loop 214.

Because the conventional circuit design system of FIG. 5 requires each placeholder design with its corresponding phase-locked loop configuration to be compiled before the final circuit design is compiled, there will always be at least two design compilations required to generate the final configuration data. When a logic designer desires to implement multiple phase-locked loop configurations in a circuit design, the number of design compilations will increase to a design compilation for each placeholder design (i.e., for each phase-locked loop configuration) and a final design compilation to compile the full circuit design.

Figure 6:
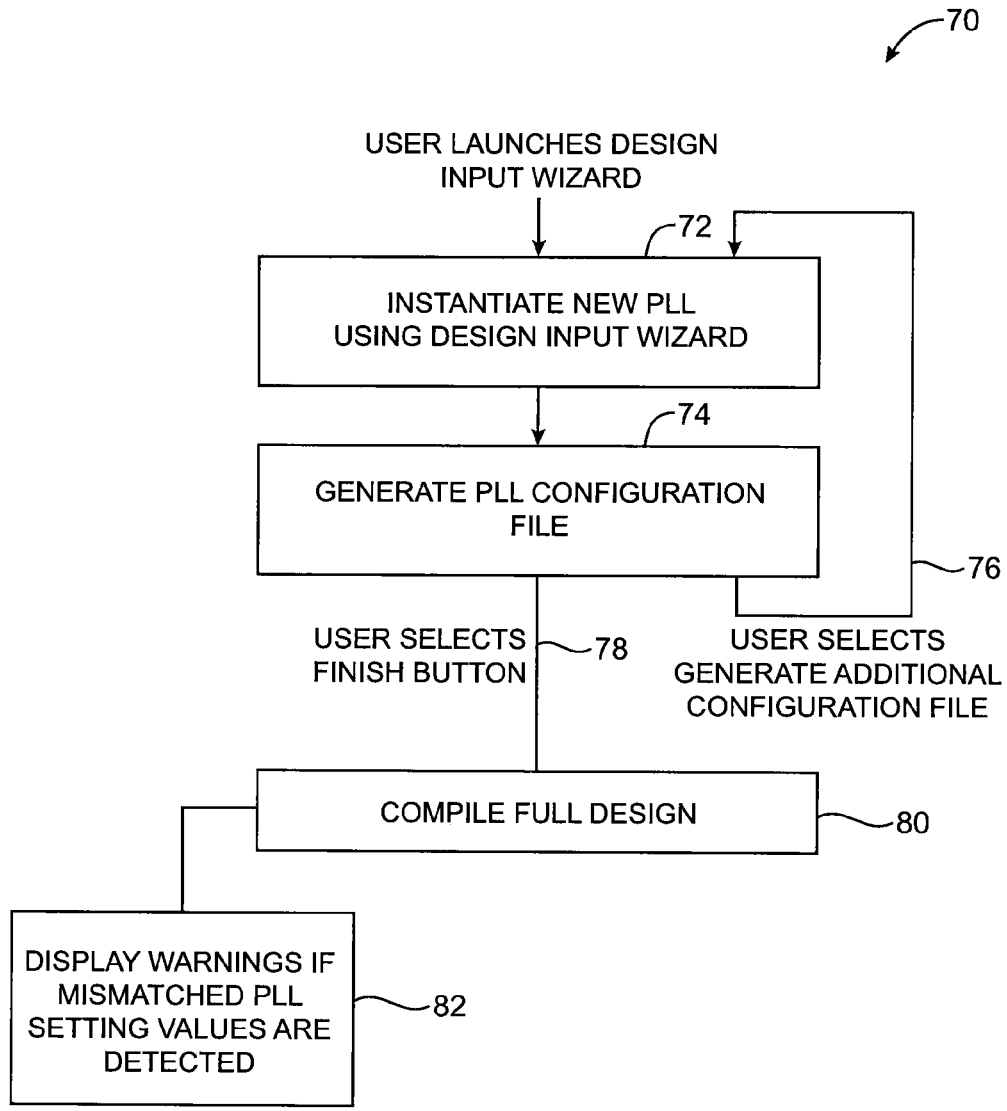
FIG. 6 is a flowchart of illustrative steps involved in generating phase-locked loop initialization files and compiling a circuit design using CAD tools in accordance with an embodiment of the present invention.

Illustrative operations involved in using circuit design tools such as computer-aided-design tool 62 are shown in FIG. 6. As shown in FIG. 6, a user (e.g., a logic designer) may launch design input wizard 64 as illustrated by line 70 to begin the process of producing phase-locked loop scan chain initialization files and compiling a circuit design.

In step 72, the user may instantiate a phase-locked loop configuration using design input wizard 64 to provide phase-locked loop design data to CAD tool 62. The user may use tool 62 to configure the instantiated phase-locked loop using any suitable technique. For example, design input wizard 64 may present the user with one or more screens of options associated with phase-locked loops. The user may click on on-screen options to direct tool 62 to configure the features of the phase-locked loop being designed. With another suitable arrangement, the user may configure the phase-locked loop by entering lines of hardware description language code, by editing a design obtained from a library, or by combinations of these and other techniques. For example, the user may configure the phase-locked loop by providing a phase-locked loop design using a hardware description language such as Verilog hardware description language (HDL) or Very High Speed Integrated Circuit Hardware Description Language (VHDL).

In general, the user may configure any suitable property of the instantiated phase-locked loop. For example, the user may configure features of the phase-locked loop by providing phase-locked loop parameters such as a loop filter resistance parameter (e.g., to determine the resistance value of a resistor in an RC filter circuit that is part of a phase-locked loop circuit), a divider setting (e.g., a divider setting for a divider in a feedback path or a downstream clock divider), a charge pump current parameter (i.e., to set the output current of a charge pump), a high frequency capacitor capacitance parameter, etc.

After the user has finished their configuration of the phase-locked loop using tool 62 in step 72, the user may use tool 62 to generate a phase-locked loop configuration file (i.e., a phase-locked loop initialization file) in step 74. The phase-locked loop configuration file (PLL scan chain initialization file) may be generated by the phase-locked loop scan chain initialization file generator engine 66 (FIG. 4). The user may initiate engine 66 by selecting an on-screen option such as an on-screen "Generate" button in design input wizard 64 (e.g., an on-screen button in the one or more screens of options associated with phase-locked loops). The phase-locked loop configuration file may contain data bits that represent all of the phase-locked loop parameters necessary to implement the user's phase-locked loop configuration. The phase-locked loop configuration file may be in any suitable format such as a memory initialization file (MIF) format, a hexadecimal (HEX) format, etc.

As indicated by line 76, the user may generate multiple phase-locked loop configuration files to support phase-locked loop dynamic reconfiguration operations by repeating steps 72 and 74. The user may repeat steps 72 and 74 by selecting an on-screen option to generate additional configuration files (e.g., by selecting an on-screen option captioned "Generate A Configuration File").

If desired, the operations of step 74 may be performed only a single time after multiple iterations of the operations of step 72. For example, the user may instantiate and configure multiple phase-locked loops in multiple iterations of step 72 and then select an on-screen "Generate" or "Finish" button a single time to generate phase-locked loop configurations files for each of those phase-locked loops.

After the user has completed the full circuit design including one or more phase-locked loop configurations, the full circuit design may be compiled by compiler 68 in step 80. With one suitable arrangement, the user may select an on-screen finish option to initiate the compilation of the full circuit design by compiler 68 (as indicated by line 78). When compiler 68 compiles the full circuit design, each of the phase-locked loop configuration files that were generated in steps 72 and 74 may be used in conjunction with a circuit design to generate an output in a desired format such as configuration data for a programmable logic device. The output may be in any appropriate format such as a programmer object file format (i.e., a POF file format) or an SRAM object file format (i.e., a SOF file format).

As part of the operations of step 80, a comparator module in computer-aided-design tool 62 may verify the contents of each phase-locked loop configuration file (e.g., each phase-locked loop scan chain initialization file) by comparing the phase-locked loop design parameters in each file against the associated phase-locked loop design parameters in the circuit design (i.e., the design netlist). If any mismatches between the phase-locked loop settings in the phase-locked loop configuration file and the phase-locked loop settings in the circuit design are found, CAD tool 62 may display warnings of the mismatched phase-locked loop setting values in step 82. The warnings may include detailed reports of the parameters whose values are found to be different as well as what those different values are in the relevant phase-locked loop configuration files and in the circuit design.

Figure 7:
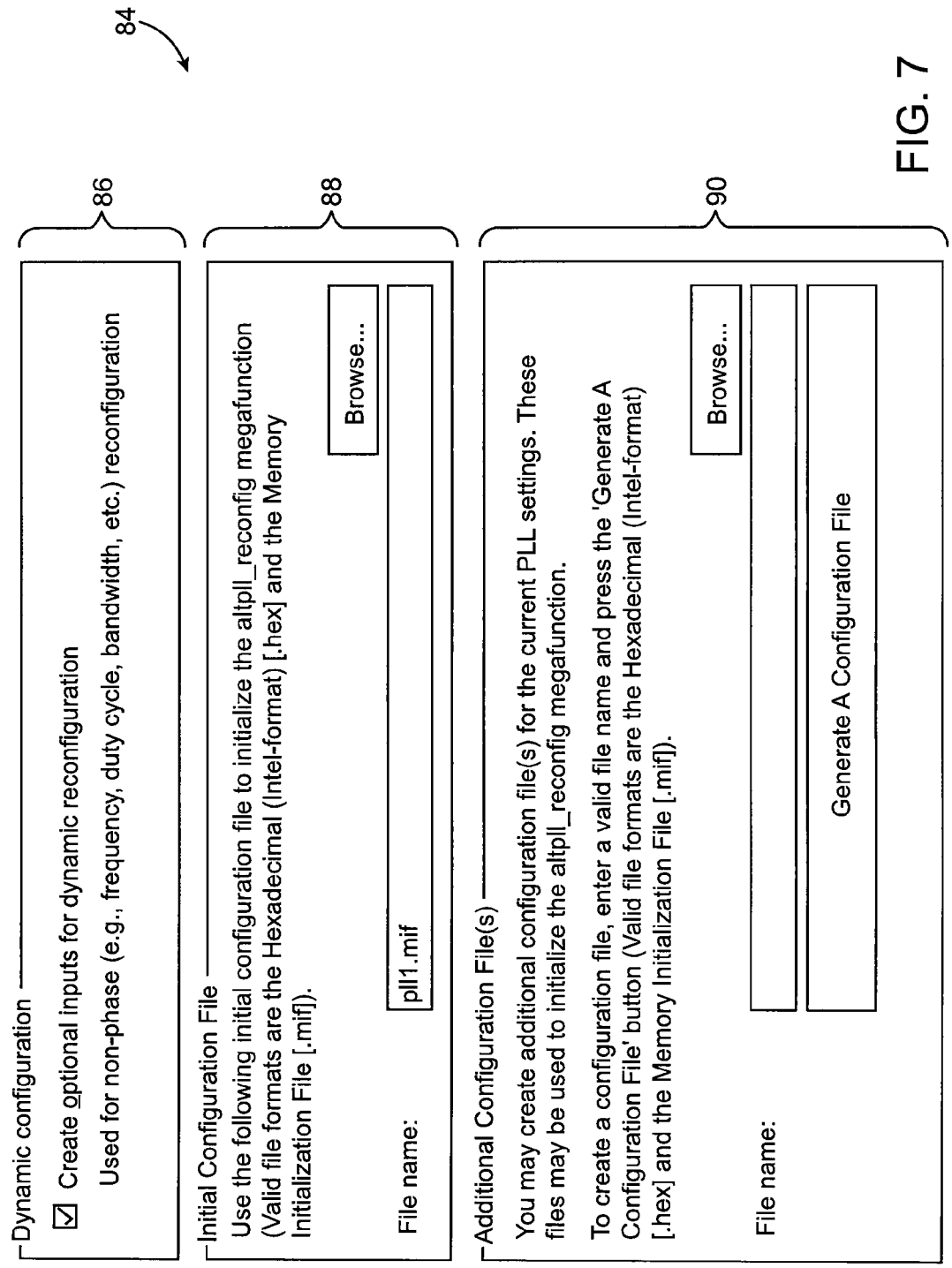
FIG. 7 is an illustrative display screen that may be presented by CAD tools to a logic designer when designing an integrated circuit with real-time dynamic reconfiguration capabilities in accordance with an embodiment of the present invention.

FIG. 7 shows an illustrative display screen 84 that may be presented to a logic designer by CAD tool 62 as part of a circuit design process.

As shown in FIG. 7, CAD tool 62 may display a screen of options for a circuit designer that includes an option to implement dynamic reconfiguration of phase-locked loop circuitry. For example, CAD tool 62 may present the logic designer with an on-screen selectable option to "create optional inputs for dynamic reconfiguration" as shown in box 86 of FIG. 7. Screen 84 of FIG. 7 may be one of many tabbed screens within CAD tool 62.

Regardless of whether the logic designer has selected the option to implement dynamic reconfiguration, CAD tool 62 may present an option for the logic designer to supply a phase-locked loop initialization file. For example, even if the logic designer has not selected the option to implement dynamic reconfiguration of phase-locked loops in box 86, CAD tool 62 may display box 88. The on-screen options of box 88 may allow the logic designer to supply an initial phase-locked loop configuration file.

When the logic designer has indicated that he desires to implement dynamic reconfiguration capabilities, CAD tool 62 may present the logic designer with the screen of FIG. 7 so that the logic designer may supply CAD tool 62 with multiple phase-locked loop configuration files.

In the example of FIG. 7, the logic designer has selected the option to implement dynamic reconfiguration capabilities in box 86 and has supplied only the initial configuration file "pll1.mif" in box 88. Box 90 may be displayed by CAD tool 62 to present the logic designer with an opportunity to supply a first additional configuration file. With one suitable arrangement, after the logic designer supplies each additional configuration file to CAD tool 62, an additional box similar to box 88 may be displayed to the logic designer. Each additional box may be similar to box 88 except that the additional boxes will refer not to the initial configuration file but to an appropriately numbered additional configuration file (e.g., the first additional configuration file, the second additional configuration file, etc.)

In general, the logic designer may supply CAD tool 62 with any number of additional configuration files using any suitable input technique. With one illustrative method, the logic designer may select the "Browse" option in box 90 and then, using on-screen options or another suitable method, supply CAD tool 62 with a configuration file that has already been generated.

With another method, the logic designer may select the "Generate A Configuration File" option in box 90. The option to generate an additional configuration file in box 90 may allow the user to instantiate a new phase-locked loop configuration (e.g., the "Generate A Configuration File" option in box 90 can use phase-locked loop design data entered in other screens that are part of CAD tool 62 to generate a configuration file).

An illustration screen 92 of warning messages that may be displayed by CAD tool 62 is shown in FIG. 8. The screen of FIG. 8 may be an example of the warnings that are displayed by tool 62 in step 82 of the flowchart of FIG. 6 when mismatched phase-locked loop settings are detected. Mismatches may arise when a user edits a file of settings using an external editing tool.

In the example of FIG. 8, CAD tool 62 displays two specific warnings that specific parameters contained in the scan chain initialization file "pll_de_clk0.mif" do not match the initial state of the scan chain for the phase-locked loop (e.g., the parameters in the initialization file do not match the parameters for the initial phase-locked loop configuration contained in the design netlist). As shown in FIG. 8, each warning may contain specific information regarding the mismatch such as the name of parameter that is mismatched and the values of the parameter in the scan chain initialization file and in the design netlist.

Figure 9:
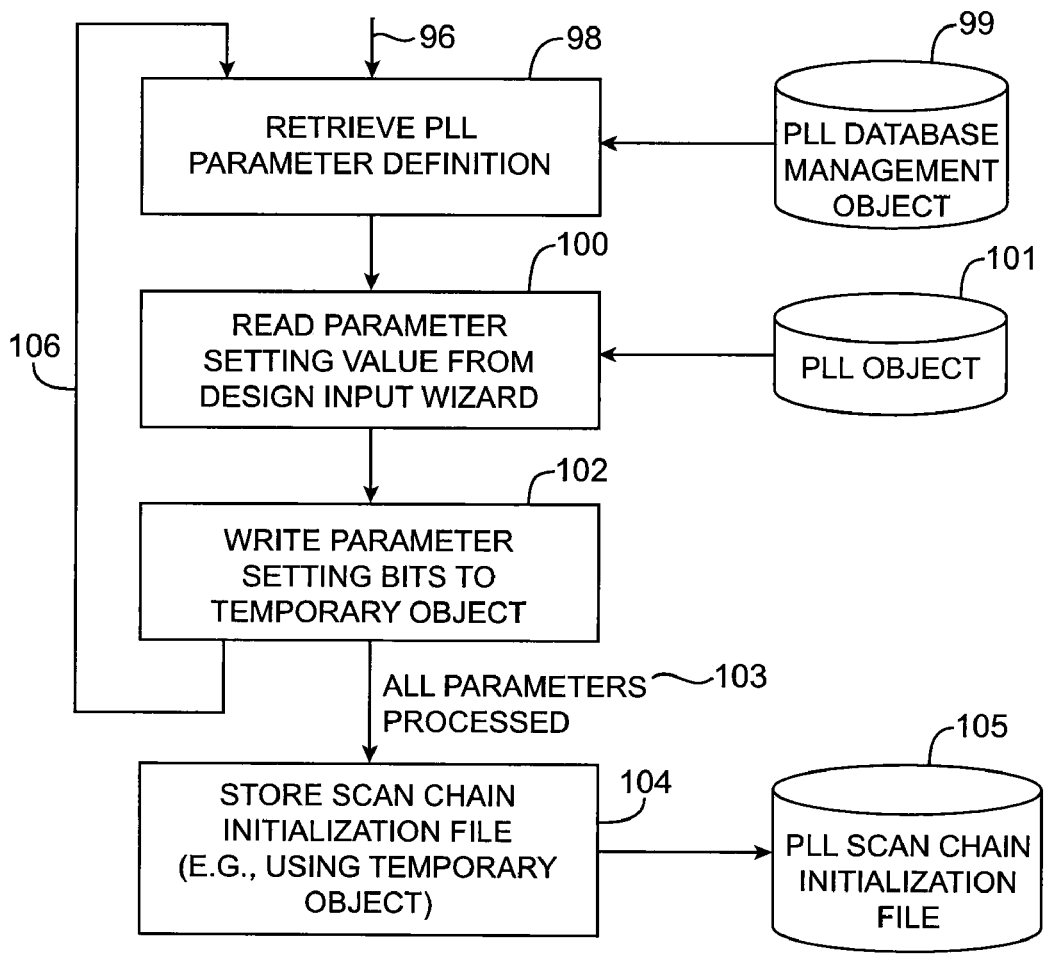
FIG. 9 is a flowchart of illustrative steps involved in generating a phase-locked loop initialization file in accordance with an embodiment of the present invention.

Illustrative operations involved in using phase-locked loop scan chain initialization file generator engine 66 to generate phase-locked loop configuration files are shown in FIG. 9. The operations of FIG. 9 may be performed as part of step 74 of FIG. 6 (as illustrated by line 96) after the logic designer has completed their design of a particular phase-locked loop configuration in step 76. In the operations of FIG. 9, phase-locked loop scan chain initialization file generator engine 66 may use data stored in storage (i.e., phase-locked loop object 101) together with data from a device database 99 that is specific to a particular integrated circuit family (or model) to generate an initialization file that is stored in storage such as object 105. If desired, database 99 may contain data relevant to a multitude of families or models of phase-locked loops (i.e., that could be implemented in various families or models of programmable logic device integrated circuits).

In step 98 of FIG. 9, initialization file engine 66 may retrieve a phase-locked loop parameter definition from a phase-locked loop database such as phase-locked loop database management object 99. Each phase-locked loop parameter definition may represent a specific configurable parameter for a particular type of integrated circuit (e.g., a particular family of integrated circuits or a particular model of integrated circuit). Because each particular model or family of integrated circuits may have different configurable parameters, the use of a phase-locked loop database such as object 99 may allow CAD tool 62 and initialization file engine 66 to be coded generically (e.g., so that a single CAD tool 62 and engine 66 can be used to create circuit designs for multiple different types of integrated circuits and/or upgraded integrated circuits). With this type of arrangement, the phase-locked loop database object 99 stores device-specific phase-locked loop-related information such as the number of bits for a phase-locked loop's charge pump current parameter and other information specific to a particular family of phase-locked loop circuitry.

In step 100, initialization file engine 66 may read the parameter setting value for the phase-locked loop parameter retrieved in step 98 from phase-locked loop object 101. Phase-locked loop object 101 may contain data generated by a user as part of instantiating and configuring a phase-locked loop configuration in step 72 of FIG. 6

In step 102, initialization file engine 66 may write the parameter setting value that was retrieved in step 100 into a temporary object.

As indicated by line 106, steps 98, 100, and 102 may be repeated until all of the parameters have been processed. After all of the parameters have been processed (e.g., as indicated by line 103), initialization file engine 66 will use the temporary object to create an output. The output of engine 66 will be a scan chain initialization file in an appropriate format such as the MIF format or the HEX format and can be stored for later use as by phase-locked loop scan chain initialization file 105.

Figure 10:
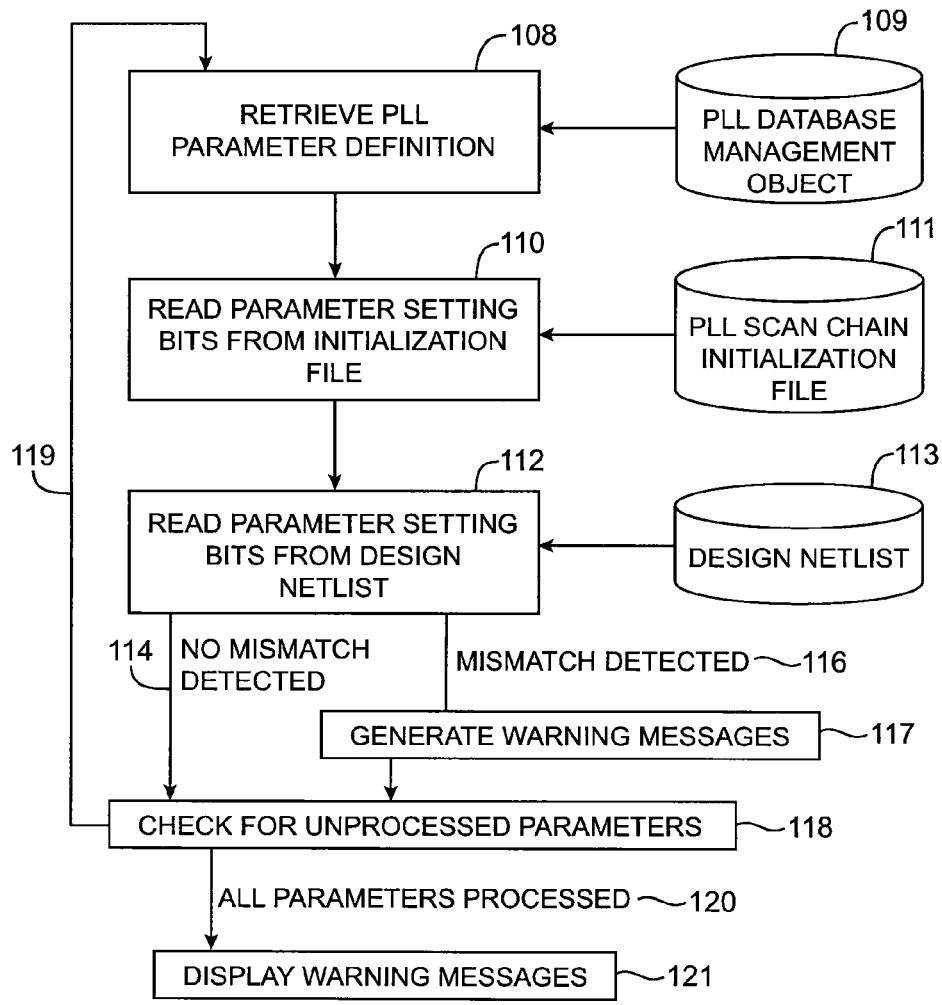
FIG. 10 is a flowchart of illustrative steps involved in checking for mismatches between phase-locked loop settings in a phase-locked loop initialization file and in a design netlist in accordance with an embodiment of the present invention.

FIG. 10 shows illustrative operations involved in checking for mismatches between phase-locked loop parameter values. The operations of FIG. 10 may be used to display warning messages on a CAD system display such as the warning messages that are displayed in step 82 in FIG. 6. If desired, the operations of FIG. 10 may be performed by compiler 68, or any other suitable tool in CAD tool 62, as part of the compilation process of step 80 in FIG. 6.

At step 108, compiler 68 can retrieve a phase-locked loop parameter definition from a phase-locked loop database such as phase-locked loop database management object 109. In general, database 109 may contain phase-locked loop parameter definitions for a multitude of families or models of phase-locked loops (i.e., that could be implemented in various families or models of programmable logic device integrated circuits).

At step 110, compiler 68 will read the parameter setting bits from the phase-locked loop initialization file such as phase-locked loop scan chain initialization file 111.

At step 112, compiler 68 will read the parameter setting bits from the full circuit design netlist 113. The setting bits that are read from the initialization file and the design netlist will correspond to the parameter definition retrieved in step 108.

As indicated by line 116, if a mismatch is detected between the parameter setting bits in the initialization file and the design netlist, appropriate warning messages may be generated in step 117. The warning messages may include all of the relevant information about the mismatched phase-locked loop settings. After step 117, compiler 68 will perform the operations of step 118.

As indicated by line 114, if no mismatch is detected between the parameter setting bits, compiler 68 will skip the operations of step 117 and perform the operations of step 118.

In step 118, compiler 68 can check whether there are any phase-locked loop parameters that have not yet been checked for mismatches. If there are parameters that have not yet been checked, the operations of steps 108, 110, 112, and, if necessary, step 117 may be repeated as illustrated by line 119 until all of the parameters have been processed.

As indicated by line 120, after all of the parameters have been processed and any desired warning messages have been generated, compiler 68 can display any relevant warring messages in step 120 (e.g., compiler 68 can display the warning messages that were created in step 117).

With one suitable arrangement, the phase-locked loop initialization file and design netlist are configured so that each phase-locked loop parameter is treated as a single block of data bits rather than having a set of contiguous bits representing all of the phase-locked loop parameters. For example, engine 66 may be configured to generate initialization files that maintain boundaries between each phase-locked loop parameter. The ability of CAD tool 62 to provide detailed warning messages such as the messages of FIG. 8 that include an identification of the mismatched parameter as well as the parameters' conflicting values may be facilitated by this compartmentalization of phase-locked loop parameters.

If desired, the comparison of the phase-locked loop parameter setting value in the initialization file to the phase-locked loop parameter setting value in the design netlist may occur as a comparison of data bits. By comparing data bits directly, the data bits do not have to be converted to their corresponding phase-locked loop setting value to check for mismatches. In order to generate the detailed warning messages, the data bits may be converted to their corresponding logical phase-locked loop setting value.

The foregoing is merely illustrative of the principles of this invention and various modifications can be made by those skilled in the art without departing from the scope and spirit of the invention.

What is claimed is:

1. A method comprising:
   receiving phase-locked loop circuitry design data associated with a given configuration of phase-locked loop circuitry; and
   with a phase-locked loop scan chain initialization file generator engine that is contained in a design input wizard in a computer-aided design tool, generating initialization data associated with the given configuration from the design data.

2. The method defined in claim 1 further comprising:
   with a compiler that is separate from the design input wizard, compiling a circuit design based at least partly on the initialization data associated with the given configuration.

3. The method defined in claim 2, wherein the phase-locked loop circuitry is implemented in a programmable logic device as part of a user's customer logic design, the method further comprising:
   receiving the user's custom logic design with the computer-aided design tool.

4. The method defined in claim 1 further comprising:
   receiving additional phase-locked loop circuitry design data associated with additional configurations of the phase-locked loop circuitry; and
   with the phase-locked loop scan chain initialization file generator engine, generating initialization data associated with the additional configurations from the additional phase-locked loop circuitry design data.

5. The method defined in claim 4 further comprising:
   with a compiler that is separate from the design input wizard, compiling a circuit design based at least partly on the initialization data associated with the given configuration and the additional configurations.

6. The method defined in claim 5, wherein the phase-locked loop circuitry is implemented in a programmable logic device as part of a user's customer logic design, the method further comprising:
   receiving the user's custom logic design with the computer-aided design tool.

7. The method defined in claim 6, wherein generating the initialization data associated with the given configuration from the design data and generating initialization data associated with the additional configurations comprises repeatedly using the phase-locked loop scan chain initialization file generator engine to generate phase-locked loop scan chain initialization files without invoking the compiler.

8. A computer program product embedded on non-transitory computer storage media, which when executed by a computer, causes the computer to implement a method for generating initialization data for phase-locked loop circuitry, the computer program product comprising:
   code for receiving phase-locked loop circuitry design data associated with a given configuration of the phase-locked loop circuitry; and
   code for generating initialization data associated with the given configuration from the phase-locked loop circuitry design data with a phase-locked loop scan chain initialization file generator engine that is contained in a design input wizard in a computer-aided design tool.

9. The computer program product defined in claim 8 further comprising:
   code for compiling a circuit design based at least partly on the initialization data associated with the given configuration with a compiler that is separate from the design input wizard.

10. The computer program product defined in claim 8, wherein the phase-locked loop circuitry is implemented in a programmable logic device as part of a user's customer logic design, the software further comprising:
    code for receiving the user's custom logic design with the computer-aided design tool.

11. The computer program product defined in claim 8 further comprising code for repeatedly using the phase-locked loop scan chain initialization file generator engine to generate multiple phase-locked loop scan chain initialization files without invoking a compiler.

12. A logic design system comprising:
    a database operable to store parameter definitions for multiple different phase-locked loop circuits; and
    computing equipment operable to implement a computer-aided design tool operable to retrieve one of the parameter definitions to generate initialization data for a phase-locked-loop circuit to be implemented on the programmable integrated circuit.

13. The logic design system defined in claim 12, wherein the computing equipment is further configured to implement a design input wizard in the computer-aided design tool that contains a phase-locked loop scan chain initialization file generator engine operable to generate the initialization data.

14. The logic design system defined in claim 13, wherein the computing equipment is further configured to implement a compiler in the computer-aided design tool that is separate from the design input wizard.

15. The logic design system defined in claim 13, wherein the initialization data that is generated by the initialization file generator engine comprises a phase-locked loop scan chain initialization file and wherein the computing equipment is further configured to implement a compiler operable to generate a warning message for a user of the computer-aided design tool in response to a mismatch between the phase-locked loop scan chain initialization file and circuit design data received from the user.

16. The logic design system defined in claim 12, wherein the parameter definitions include at least one loop filter parameter for the phase-locked-loop circuit.

17. The logic design system defined in claim 12, wherein the parameter definitions include at least one charge pump current parameter for the phase-locked-loop circuit.

18. The logic design system defined in claim 12, wherein the parameter definitions include at least one feedback path divider setting for the phase-locked-loop circuit.

19. The logic design system defined in claim 12, wherein the computing equipment is further configured to implement a compiler in the computer-aided design tool operable to generate warning messages for a user of the computer-aided design tool in response to a mismatch between a parameter setting associated with the initialization data and circuit design data received from the user.

20. A computer-implemented method for using a computer-aided-design tool to generate initialization files for dynamically-reconfigurable phase-locked loop circuitry in an integrated circuit, comprising:

with the computer-aided-design tool, receiving phase-locked loop circuitry design data associated with a given configuration of the dynamically-reconfigurable phase-locked loop circuitry; and with a phase-locked loop scan chain initialization file generator engine that is contained in a design input wizard in the computer-aided design tool, using the design data to generate an initialization file associated with the given configuration of the dynamically-reconfigurable phase-locked loop circuitry.

\* \* \* \* \*